United States Patent [19]

Rothgery et al.

[11] Patent Number: 4,812,896
[45] Date of Patent: Mar. 14, 1989

[54] METAL ELECTRONIC PACKAGE SEALED WITH THERMOPLASTIC HAVING A GRAFTED METAL DEACTIVATOR AND ANTIOXIDANT

[75] Inventors: Eugene F. Rothgery, No. Branford; William W. C. Hart, Bethany; Edward F. Smith, III, Madison; Steven D. Phillips, Northford; Bonnie B. Sandel, Milford; David F. Gavin, Cheshire, all of Conn.

[73] Assignee: Olin Corporation, New Haven, Conn.

[21] Appl. No.: 930,162

[22] Filed: Nov. 13, 1986

[51] Int. Cl.⁴ .................. H01L 23/48; H01L 29/44; H01L 29/52; H01L 29/60
[52] U.S. Cl. .................................. 357/70; 357/72
[58] Field of Search ........................ 357/72, 70

[56] References Cited

U.S. PATENT DOCUMENTS

| | | | |
|---|---|---|---|
| 3,085,003 | 4/1963 | Morris | 44/78 |
| 3,563,949 | 10/1967 | Habeck et al. | 260/45.95 |
| 3,728,177 | 4/1973 | Caule et al. | 156/3 |
| 3,907,925 | 9/1975 | Cowell et al. | 260/791 |
| 3,931,103 | 6/1976 | Hardy | 260/45.85 B |
| 3,994,791 | 11/1976 | Cowell et al. | 260/791 |
| 4,049,875 | 9/1977 | Edie | 428/462 |
| 4,077,948 | 3/1978 | Cowell et al. | 260/79.5 R |
| 4,103,861 | 8/1978 | Hascoe | 174/52 FP |
| 4,213,892 | 7/1980 | Scott | 260/45.95 C |
| 4,306,930 | 12/1981 | Cowell et al. | 156/307.7 |
| 4,410,927 | 10/1983 | Butt | 361/386 |
| 4,461,924 | 7/1984 | Butt | 174/52 FP |
| 4,469,834 | 9/1984 | Shearer et al. | 524/193 |
| 4,480,262 | 10/1984 | Butt | 357/74 |
| 4,521,469 | 6/1985 | Butt et al. | 428/35 |
| 4,524,238 | 6/1985 | Butt | 174/52 FP |
| 4,525,422 | 6/1985 | Butt et al. | 428/418 |
| 4,582,556 | 4/1986 | Butt et al. | 156/325 |
| 4,594,770 | 6/1986 | Butt | 29/588 |
| 4,603,161 | 7/1986 | Phillips et al. | 524/239 |
| 4,696,851 | 9/1987 | Pryor | 428/210 |

OTHER PUBLICATIONS

Thermal Characteristics of 16- and 40-Pin Plastic DIP's by Andrews et al., published in the IEEE Transactions on Components, Hybrids and Manufacturing Technology, vol. CHMT-1, No. 4, Dec. 1981.

Factors Governing Aluminium Interconnection Corrosion in Plastic Encapsulated Microelectronic Devices by Neighbour et al., published in Microelectronics and Reliability, Pergamon Press, Great Britain, vol. 16, 1977, pp. 161-164.

Factors Contributing to the Corrosion of the Aluminum Metal on Semiconductor Devices Packaged in Plastics by Olberg et al., published in Microelectronics and Reliability, Pergamon Press, Great Britain, vol. 15, 1976, pp. 601-611.

Primary Examiner—Andrew J. James
Assistant Examiner—Sara W. Crane
Attorney, Agent, or Firm—Gregory S. Rosenblatt; Paul Weinstein

[57] ABSTRACT

A package and process of assembling a package adapted for housing an electronic component. The package includes metallic base, lid and leadframe components sealed together with a thermoplastic material. The thermoplastic has an additive consisting essentially of a metal deactivator and a primary antioxidant grafted thereto without cross linking so as to maintain the thermoplastic properties.

8 Claims, 1 Drawing Sheet

METAL ELECTRONIC PACKAGE SEALED WITH THERMOPLASTIC HAVING A GRAFTED METAL DEACTIVATOR AND ANTIOXIDANT

While the invention is subject to a wide range of applications, it is especially directed to a unique thermoplastic suited for the sealing of a semiconductor package and will be particularly described in that connection. The disclosed thermoplastic is a polyolefin having a grafted additive consisting essentially of a metal deactivator and a primary antioxidant.

CROSS REFERENCES TO RELATED APPLICATIONS

This application relates to U.S. Pat. No. 4,480,262 entitled SEMICONDUCTOR CASING by S. H. Butt; U.S. Pat. No. 4,461,924 entitled SEMICONDUCTOR CASING by S. H. Butt; U.S. Pat. No. 4,603,161 entitled SELECTED OXYALKYLATED 2,6-DIALKYL-PHENOL COMPOUNDS AND THEIR USE AS STABILIZERS OF ORGANIC MATERIALS AGAINST OXIDATIVE DEGRADATION by S. D. Phillips et al.; U.S. Pat. No. 4,521,469 entitled CASING FOR ELECTRONIC COMPONENTS by S. H. Butt et al; U.S. Pat. No. 4,525,422 entitled ADHESION PRIMERS FOR ENCAPSULATING EPOXIES by S. H. Butt et al.; U.S. Pat. No. 4,582,556 by S. H. Butt et al. entitled ADHESION PRIMERS FOR ENCAPSULATING EPOXIES and U.S. Pat. No. 4,594,770 entitled A METHOD OF MAKING SEMICONDUCTOR CASING by S. H. Butt.

BACKGROUND OF THE INVENTION

Increasing power and power densities in new, high complexity semiconductor devices are creating heat removal problems which are taxing current packaging capabilities. Increased power produces higher junction temperatures which lead to potentially faster degradation of both device reliability and system performance. Current user trends towards higher ambient temperatures combined with severe limitations on external cooling, and potting of packages for applications such as those associated with automotive products create additional factors which require consideration. With cost pressures compounding the problem, low cost packages require upgraded thermal performance to meet increased performance demands.

Dual in-line packages (DIP's) have been, and still are, the "workhorse" of integrated circuit (IC) packaging. Plastic DIP's dominate most low reliability applications. The ruggedness, low cost, and handling capabilities of plastic DIP's are attractive characteristics for high volume usage. Their increased use in hostile environments, combined with increased device and mounting surface temperatures, has resulted in extensive attempts to improve the design and materials of the plastic package. Unfortunately, constraints on materials selection, package design, and heatsinking make improvements in heat removal more difficult to obtain than from other discrete and ceramic packages. The effect and improvement in packaged devices thermal characteristics is reviewed in an article entitled *Thermal Characteristics of 16- and 40-Pin Plastic DIP's* by Andrews et al. published in the IEEE TRANSACTIONS ON COMPONENTS, HYBRIDS AND MANUFACTURING TECHNOLOGY, VOL. CHMT-1 NO. 4, DECEMBER, 1981.

A plastic DIP is a plastic molded package in which an electronic device, supported on a lead frame, is molded into an encapsulating plastic. This plastic package has several reliability problems. Firstly, failures in the plastic to metal bond provide an avenue through which moisture and other contaminants can contact the electronic device and cause corrosion failures. This problem has been documented in an article entitled *Factors Governing Aluminum Interconnection Corrosion in Plastic Encapsulated Microelectronic Devices* by Neighbour and White, published in MICROELECTRONICS AND RELIABILITY, Pergamon Press, Great Britain, Vol. 16, 1977, pages 161–164.

Even when corrosion failures do not occur, diffusion of environmental contaminants through the plastic or through the gradual degradation of the plastic may lead to malfunction of the encapsulated electronics. These sources of malfunction have been examined in an article entitled *Factors Contributing to the Corrosion of the Aluminum Metal on Semiconductor Devices Packaged in Plastics* by Olberg and Bozarth, published in MICROELECTRONICS AND RELIABILITY, Pergamon Press, Great Britain, Vol. 15, 1976, pages 601–611.

The prior art recognizes the combination of antioxidants with polyolefins to provide a heat stabilizer against formation of free radicals during the manufacturing process. An example is disclosed in U.S. Pat. No. 4,213,892. The antioxidant functions by controlling chain scission. However, it is not thought that the prior art discloses a combination antioxidant and metal deactivator (described below) being grafted onto a polyolefin.

Attempts have heretofore been made to improve adhesion of a polymer to metals by adding metal deactivators to the polymer as illustrated in U.S. Pat. Nos. 3,907,925, 3,994,987, 4,049,875, 4,077,948 and 4,306,930. The metal deactivators are provided to prevent the degradation of the polymer by metal ions. These metals, such as titanium or magnesium, may be present as chlorides. The metals tend to degrade the polymer over time. In addition, when the polymer is adhered to the surface of copper, the copper being a good catalyst for most polymer degradation, provides copper ions which tend to migrate into the bulk of the polymer from the interface between the copper and the polymer. The metal deactivators chelate and capture the ions going into the polymer from the interface.

A well-known compound for preventing corrosion is maleic acid or maleic anhydride. The grafting of maleic acid (Jpn. Kokai Tokyo Koho No. 58,183,733) or maleic anhydride (Jpn. Kokai Tokyo No. 58,166,040) onto polyolefins for improved polymeric adhesion to metal surfaces is well known in the art. However, these grafted polymers show instability toward oxidation when adhered to a metallic surface such as copper, since copper acts as an efficient catalyst for oxidation in polyolefins.

To the best of our knowledge, the grafting of a dual functional metal deactivator and antioxidant molecule onto a polyolefin is unknown in the art. Such a grafted polymer would be expected to exhibit both good metal adhesion, due to the metal chelating functionality, and good oxidative stability, due to the antioxidant and metal deactivating functionality.

SUMMARY OF THE INVENTION

It is a problem underlying the present invention to provide a thermoplastic sealing material for sealing a package encasing an electronic component. The sealing material requires extended thermal capabilities and substantial resistance to diffusion of contaminants into the enclosure.

It is an advantage of the present invention to provide a package and process of forming a package adapted for housing an electronic component which obviates one or more of the limitations and disadvantages of the described prior arrangements.

It is a further advantage of the present invention to provide a package and process of forming a package for housing an electronic component incorporating materials having a high temperature capability.

It is a yet further advantage of the present invention to provide a package and process of forming a package for housing an electronic component incorporating a thermoplastic containing a grafted metal deactivator and an antioxidant as a sealing component capable of strongly bonding to the base, lid and leadframe of the package.

It is a still further advantage of the present invention to provide a package and process of forming a package for housing an electronic component wherein a thermoplastic having a grafted additive seals the package with a relatively inexpensive manufacturing technique.

Accordingly, there has been provided a package and process of assembling a package adapted for housing an electronic component. The package includes metallic base, lid and leadframe components sealed together with a thermoplastic material. The thermoplastic has an additive consisting essentially of a metal deactivator and a primary antioxidant grafted thereto without cross linking so as to maintain the thermoplastic properties.

BRIEF DESCRIPTION OF THE DRAWINGS

The invention and further developments of the invention are now elucidated by means of the preferred embodiment shown in the drawings.

DESCRIPTION OF THE PREFERRED EMBODIMENTS

Figure 2:
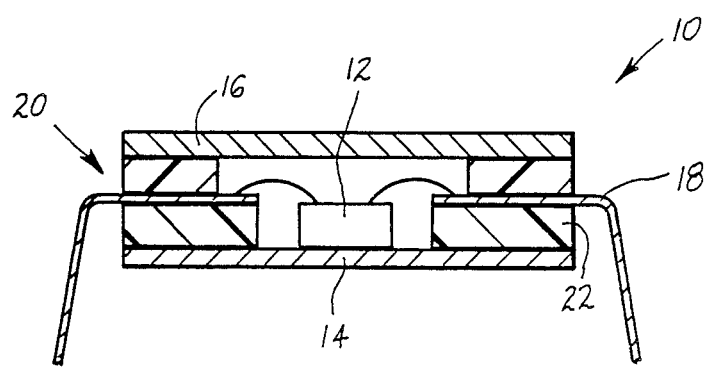
FIG. 2 is a cross section of a package housing containing an electronic component in accordance with the present invention.

Referring to FIG. 2, a package 10 adapted for housing an electronic component 12 is illustrated. The package includes a metallic base component 14, a metallic lid component 16 and a leadframe 18 disposed between the base and lid components. A thermoplastic material 20 seals the leadframe between the lid and base components. The thermoplastic material comprises a polyolefin having an additive consisting essentially of a metal deactivator and a primary antioxidant grafted thereto without cross linking so as to maintain thermoplastic properties. The additive substantially reduces the degradation of the thermoplastic material.

The metallic material used for the base component, the housing member and the leadframe may be selected from any desired metal or alloy such as copper, aluminum, iron and mixtures thereof. Preferably, the material is a copper or copper alloy because the unique thermoplastic of the present invention is particularly designed to form strong bonds with copper or copper alloy.

In the past, it was conventional practice to use carboxy-grafted polyolefins as adhesives for joining copper or copper alloy parts used in various electronic or other applications. Although they made excellent adhesives, the copper ions tended to migrate into the plastic matrix where they catalyzed the autoxidation of the polyolefin. The result was that the adhesive degraded and lost physical strength. Conventionally, copper migration is retarded by the addition of copper deactivators. However, this solution is precluded for adhesive applications since the copper deactivators tend to "bloom" or migrate to the surface of the plastic. This phenomenon destroys the adhesive properties of the polyolefin.

The problem has been solved by the provision of unique compounds grafted to polyolefins in accordance with the present invention. The sealing material 20 is a thermoplastic having an additive consisting essentially of a metal deactivator and a primary antioxidant grafted thereto. The grafted thermoplastic does not have cross linking and maintains its thermoplastic qualities. An additive comprising a molecule containing a functional group capable of acting as a copper deactivator as well as a primary antioxidant is grafted onto the backbone of the polyolefin. The additive may be a compound such as benzylidene maleic hydrazide. Grafting the additive essentially anchors it to the plastic matrix it is intended to protect. The additive is now prevented from migrating within the plastic matrix and is available to chelate copper ions attempting to migrate into the matrix. Also, the additive serves to chelate metal ions, such as titanium or magnesium, which may be present in the plastic matrix as chlorides. These metals, if left unchelated, tend to catalyze polymer breakdown over time. In addition, the antioxidant aspect of the molecule controls chain scission and undesired cross-linking when the plastic is exposed to heat during the manufacturing process or in usage of the plastic. The result of grafting this additive to the polyolefin is the maintenance of the adhesive properties of the grafted polyolefin. The grafting of the additive includes reacting a molecule containing both an activated double bond capable of grafting onto a polyolefin, and a second group capable of acting as a copper deactivator and an antioxidant. Preferably, this compound is the mono(benzaldehyde hydrazone) of maleic acid,

The resulting polymer obtained by grafting this compound to polyolefins such as polyethylene, polypropylene, poly(4-methyl-1-pentene), etc. provides a suitable thermoplastic sealing material which substantially reduces the migration of metal ions into the bulk of the thermoplastic. The compound (I) has been reported in the open literature, (J. Amer. Chem. Soc., 60, 2025 (1938)). However, the product obtained by reaction of (I) with the polyolefins is thought to be a novel composition of matter.

Although the compound (I) is preferred, it is also within the terms of the present invention to use other compounds such as the oxyalkylated 2,6-dialkylphenol compounds disclosed in U.S. Pat. No. 4,603,161. Another useful compound is maleic dimethylhydrazide,

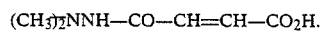

The process is preferably carried out using a carefully blended mixture of a desired weight percent of the novel additive consisting essentially of a metal deactivator and a primary antioxidant, a desired weight percent of a thermally initiated free radical generator and the remainder a polyolefin. The additive, as defined hereinbefore, is blended in particle form at the desired concentration which usually falls in the range of about 0.2 to about 1 wt % of the mixture. Preferably the additive is present in the mixture in the range of about 0.4 to about 0.6 wt %.

The thermally initiated free radical generator is chosen so as to give smooth decomposition at the desired extrusion temperatures i.e. about 180° to about 300° C. The free radical generator is preferably a peroxide initiator selected from the group consisting essentially of peroxide, persulfate and azobisisobutyronitrile. The free radical generator is preferably present in the mixture at the desired concentration of about 0.05 to about 0.4 wt. %. The peroxide initiator is preferably blended into the mixture in the liquid state. This allows the particles of additive and polyolefin to be thoroughly wetted prior to the extruding step.

Although a free radical generator is preferably added to open up bond sites on the polyolefin polymer, it is within the terms of the present invention to blend the additive with polyolefin and rely on the heat generated during the extrusion step to open the bond sites. With this case as a possibility, the concentration of free radical generator present in the mixture is about 0 to about 0.4 wt. %.

The polyolefin resins, as described hereinbefore, are preferably blended in particle form and are selected from the group consisting essentially of polyethylene, polypropylene, and poly(4-methyl-pentene) or copolymers with alkenes such as ethylene, propylene, 1-hexane and 1-butene. The polyolefin resins are preferably selected with good moisture barrier properties.

The mixture of additive, free radical generator and polyolefin are blended together, preferably in a drum, for at least about 15 minutes. The time of tumbling is not a critical aspect of the present invention and may be adjusted as required so that the components are homogeneously mixed. When the free radical generator is a liquid, the mixture is blended so that the particles are thoroughly wet.

The blended mixture is next fed into an extruder with an intensive mixing section, such as for example a twin screw compounder. The extruder heats the mixture to a melt having temperature of about 180° to about 300° C. More preferably, depending upon the peroxide, and the polymer of choice, the mixture is heated to a temperature of about 220° to about 275° C. The mixture is extruded at a pressure of about 2000 to about 3000 psi. The residence time in the extruder is about 30 seconds to about 5 minutes. However, the actual residence time is not a critical aspect of the present invention and the typical time is thought to be closer to about 2 minutes. Depending on the requirements for the shape of the grafted polyolefin, the melt is extruded into any desired shape and then cooled to a solid mass. The extruder may include a devolatilizing stage where products of the grafted polyolefin are removed. This stage may comprise a vacuum to remove the gaseous products. An advantage of the present invention is the ability at room temperature to indefinitely store the adhesive, without loss of adhesive properties. By contrast, typical thermoset epoxies have limited shelf life even at temperatures of −40° C.

The extruded polyolefin containing the additive has proven to form very strong bonds with copper sheets. In order to test for copper adhesion, a sheet of the adhesive of the present invention was compression molded between two clean copper plates. The molded plates were subjected to a hot, humid environment for various residence times. Then the copper plates were pulled apart to test for shear strength. The result of that experiment is indicated in TABLE 1(a). Under the condition F, indicated in TABLE 1(b), the lap shear strength of benzylidene maleic hydrazide (BMH) mixed with polyolefin was of a high value, i.e. 1033 psi after 2000 hours of aging. The table also indicates the effect on the same test with maleic anhydride (MA), maleic dimethylhydrazide (MDMH) and bis(4-oxyalkylated-2,6-dialkylphenol)adducts of ethylenediaminetetraacetic acid (EDTA Ester) mixed with the polyolefin. In that example, the results showed that the mixture of polyolefin with MA, MDMH and EDTA Ester did not produce strong bonds which could withstand the humid environments for the residence times set out by the testing procedure. The test results for the polyolefin mixed with the BMH compound indicated its suitability for packages adapted to contain electronic devices in adverse environments.

TABLE I(a)

Lap Shear Strength After Humid Aging* of Polyolefin (TPX-002 Resin)** Grafted with Various Compounds

| Additive | Conditions*** | 0 | Aging Time (hrs) 500 | 1000 | 2000 |
|---|---|---|---|---|---|
| Maleic Anhydride (MA) | A | 1981 psi | 838 | 1072 | 49 |
|  | B | 2096 psi | 835 | 554 | 153 |
|  | C | 1840 psi | 844 | 634 | 76 |
| Benzilidene Maleic Hydrazide (BMH) | D | 1727 psi | 977 | 206 | 172 |
|  | E | 1839 psi | 1039 | 812 | 35 |
|  | F | 1735 psi | 1251 | 1167 | 1033 |
| Maleic Dimethyl-hydrazide (MDMH) | G | 1263 psi | 0 | 0 | 0 |
|  | H | 1407 psi | 0 | 0 | 0 |
| EDTA Ester**** | I | 1023 psi | 416 | 0 | 0 |
|  | J | 970 psi | 0 | 0 | 0 |
|  | K | 942 psi | 0 | 0 | 0 |

*Humidifying conditions - 85° C., 85% relative humidity
**TPX is a trademarked polyolefin manufactured by Mitsui Petrochemical Industries, Japan
***See Table I(b) for explanation of codes.
****ethylenediaminetetraacetic acid symmetric bis[2-(3,5-di-tert-butyl-4-hydroxyphenyl)propyl]ester TABLE I(b)

Extrusion Conditions Used for Lap Shear Tests (TABLE I(a))

| Additive | Conditions | Lupersol 130 (peroxide)* Concentration @ | Additive Concentration @ | Residence Time (sec) in Extruder |
|---|---|---|---|---|
| MA | A | .05 | .2 | 80 |
|  | B | .05 | .1 | 120 |
|  | C | .05 | .1 | 50 |
| BMH | D | .05 | .44 | 80 |
|  | E | .05 | .22 | 120 |
|  | F | .10 | .44 | 120 |
| MDMH | G | .05 | .16 | 80 |
|  | H | .10 | .32 | 120 |
| EDTA Ester | I | .05 | 1.6 | 80 |
|  | J | .05 | .8 | 50 |
|  | K | .10 | 1.6 | 120 |

*Lupersol is a trademarked peroxide manufactured by Lucidol, Inc.
@ wt. % tumble mixed with cold (R.T.) resin pellets prior to extrusion (actual recovery unknown).

Figure 1:
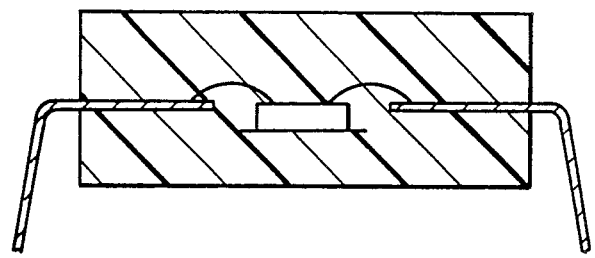
FIG. 1 is a cross section of a dual-in-line package as typically known in the prior art.

The thermoplastic having the grafted additive is particularly useful for sealing a semiconductor package as shown in FIG. 2. In the past, plastic DIP's as illustrated in FIG. 1 were commonly used in the industry. As mentioned hereinbefore, plastic DIP's do not have the thermal performance characteristics required by the conditions under which the semiconductor devices are now being subjected. To improve the thermal characteristics, a metal package as illustrated in FIG. 2 would be advantageous. Up until now, this type of package would require sealing by a thermoset adhesive such as an epoxy. However, this adhesive would have the attendant problems such as the inability to remelt the adhesive, the extended time and temperatures required for the adhesive to setup commonly produces corrosive reaction gases, and these conditions are not usually suitable for reel to reel processing. Each of these limitations has been successfully eliminated by the substitution of the polyolefin with the grafted additive as set forth in this invention. Since the polyolefin retains its thermoplastic qualities after the additive has been grafted, the adhesive can easily be heated and softened after the package has been completed. This enables recycling of the package. In addition, the setup time of the adhesive is relatively fast, i.e., seconds to minutes and permits reel to reel processing.

The process of forming the package may proceed as follows. First, the thermoplastic of the present invention is provided in sheet form with a desired thickness such as, for example, about 20 mils. The sheet is cut into preforms of a desired size. Preferably, a cavity is left in the preform to accommodate the electronic device. It is also within the terms of the present invention to manufacture suitable preforms through an injection molding, thermocompression molding or similar processes. Base and lid components 14 and 16, respectively are provided. Preferably, each has a thickness of between about 5 to about 50 mils. More preferably, the thickness is between about 10 to about 25 mils. A first preform 22 is placed on the base 14. Then the leadframe component 18 is stacked on the preform 22. This preassembly has heat applied to both the base and leadframe. The temperature may be about 180° to about 270° C. and preferably about 200° to about 250° C., depending on the polyolefin of choice. Preferably the temperature is selected to be above the melting temperature of the adhesive while maintaining a minimal flow. The temperature has to be high enough so that the adhesive will bond but not high enough so that the adhesive will flow excessively. The components are pressed together with a fixed displacement to sink the leadframe into the adhesive without covering the tips of the leadframe with the adhesive. The leadframe tips must be kept clean so that they can be subsequently wire bonded. The preassembly can then be cooled to harden the adhesive. This may be to a temperature of about 175° C. before removal from the alignment assembly. The oxide formed on the leadframe from the high temperature exposure can then be cleaned by any conventional method. The semiconductor die 12 may be bonded to the substrate 14 using a conventional die attached material such as an epoxy, thermoplastic, soft solder or polyimide. Typically, this step may be accomplished rather quickly in a temperature of about 200° C. The chip may be wire bonded to the leadframe using any desired technique such as thermosonic gold wire bonding at air temperatures of up to about 250° C. This temperature is preferably kept low in order that the leadframe tips remain rigid during bonding. Then, a second preform of adhesive 24 is disposed between the leadframe and the lid 16. This assembly is again heated to a temperature of about 180° to about 270° C. and put under an initial displacement to insure contact pressure. This displacement is chosen to insure that the adhesive does not squeeze out of the package Upon cooling, the package 10 is sealed.

Although the present invention is particularly directed to constructing semiconductor packages, it is within the scope of the present invention to take advantage of the strong bond between the grafted polyolefin and a metallic substrate in any suitable application. For example, it is within the terms of the present invention to employ the grafted polyolefin described herein as a covering on a substrate or as an adhesive to bond two or more layers of substrate components together.

Figure 3:
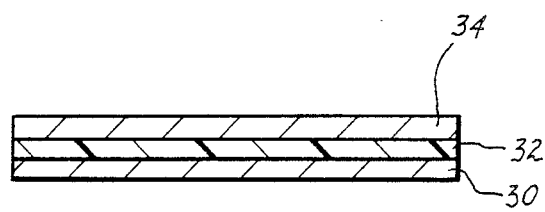
FIG. 3 is a cross section of a multilayer assembly in accordance with the present invention.

The multilayer assembly, as illustrated in FIG. 3, may comprise a metallic substrate component 30 and a layer of thermoplastic material 32 bonded to the substrate component. The thermoplastic material comprises a polyolefin having an additive consisting essentially of a metal deactivator and a primary antioxidant grafted thereto without cross linking so as to maintain the thermoplastic properties. This adhesive is described hereinbefore. The additive substantially improves the long-term adhesive properties of the thermoplastic material bonded to a metal. A first metallic component 34 is bonded to the substrate component 30 by the thermoplastic material 32. The metallic substrate and first metallic layer may be of any metal or alloy which bonds to the adhesive. Preferably, they are selected from the group of metallic materials consisting essentially of copper, aluminum, nickel, iron and alloys thereof. Although only two metallic layers are illustrated in FIG. 3, any number may be stacked as desired.

The patents and publications set forth in this application are intended to be incorporated in their entireties by reference herein.

It is apparent that there has been provided in accordance with this invention a metal electronic package sealed with thermoplastic having a grafted metal deactivator and antioxidant which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A package adapted for housing an electronic component, comprising:
    a metallic base component;
    a metallic lid component;
    a leadframe disposed between said base component and said lid component;
    a thermoplastic material sealing said leadframe between said lid and base components;
    said thermoplastic material comprising a polyolefin having an additive, said additive consisting essentially of a metal deactivator and a primary antioxidant, said additive grafted to said polyolefin without cross linking so as to maintain thermoplastic properties.

2. The package of claim 1 including said thermoplastic being a polyolefin selected from the group consisting essentially of polyethylene, polypropylene, and poly(4- methyl-pentene) or copolymers with alkenes such as ethylene, propylene, 1-hexene and 1-butene.

3. The package of claim 2 including said metal deactivator and said primary antioxidant being a compound, said compound being benzylidene maleic hydrazide,

4. The package of claim 3 wherein said metallic base and lid are formed from the group of metallic materials consisting essentially of copper, aluminum, nickel, iron and alloys thereof.

5. The package of claim 2 including said metal deactivator and said primary antioxidant being a compound, said compound being bis(4-oxyalkylated-2,6-dialkylphenol)adducts of ethylenediaminetetraacetic acid.

6. The package of claim 5 wherein said bis(4-oxyalkylated-2,6-dialkylphenol)adducts of ethylenediaminetetraacetic acid includes an ethylenediaminetetraacetic acid symmetric bis[2-(3,5-di-tert-butyl-4-hydroxyphenyl)propyl] ester.

7. The package of claim 2 including said metal deactivator and said primary antioxidant being a compound, said compound being the maleic dimethylhydrazide,

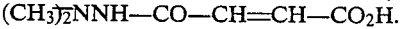

8. The package of claim 4 wherein said thermoplastic material bonds said leadframe to said base component and to said lid component.

* * * * *